United States Patent
Patti

(10) Patent No.: US 6,590,272 B2
(45) Date of Patent: Jul. 8, 2003

(54) STRUCTURE FOR A SEMICONDUCTOR RESISTIVE ELEMENT, PARTICULARLY FOR HIGH VOLTAGE APPLICATIONS

(75) Inventor: Davide Patti, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/991,555

(22) Filed: Nov. 21, 2001

(65) Prior Publication Data

US 2002/0063307 A1 May 30, 2002

(30) Foreign Application Priority Data

Nov. 24, 2000 (IT) ...................................... TO2000A1100

(51) Int. Cl.[7] .............................................. H01L 29/00
(52) U.S. Cl. ........................ 257/536; 257/538; 257/542; 257/350
(58) Field of Search ................................ 257/379, 536, 257/538, 543, 350, 358, 542, 541

(56) References Cited

U.S. PATENT DOCUMENTS 3,959,040 A * 5/1976 Robertson .................... 148/146
5,204,541 A * 4/1993 Smayling et al. ........... 257/138

* cited by examiner

*Primary Examiner*—Carl Whitehead, Jr.
*Assistant Examiner*—Yennhu B. Huynh
(74) *Attorney, Agent, or Firm*—Lisa K. Jorgenson; E. Russell Tarleton; SEED IP Law Group PLLC

(57) ABSTRACT

A structure for a semiconductor resistive element, applicable in particular to power components, having a high concentration substrate of the n type, a first epitaxial layer of the n type, a region of the p type arranged on said first epitaxial layer so to form the resistive element proper, a second epitaxial layer of n type grown on said first epitaxial layer to make the region of the p type a buried region, and an additional layer of the n type with a higher concentration with respect to the second epitaxial level, positioned on the embedded region. Low resistivity regions of the p type adapted to make low resistivity deep contacts for the resistor are provided. The buried region can be made either with a development that is substantially uniform in its main direction of extension or so to present, at on part of its length, a structure of adjacent subregions in marginal continuity. In this way, either a resistive element presenting a substantially linear performance in all ranges of applied voltage or a resistive element presenting a marked increase of the resistance value as the applied voltage increases can be made. This all with the additional possibility of selectively varying the resistance value demonstrated before the increase.

26 Claims, 4 Drawing Sheets

Figure 1:
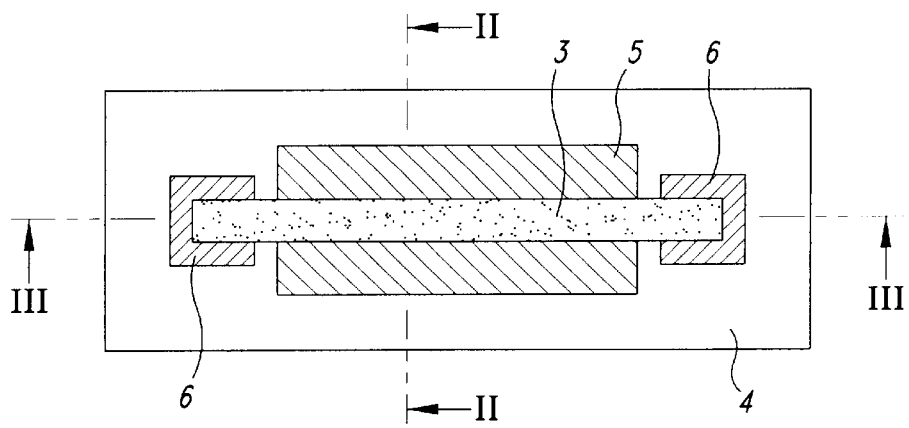

STRUCTURE FOR A SEMICONDUCTOR RESISTIVE ELEMENT, PARTICULARLY FOR HIGH VOLTAGE APPLICATIONS

BACKGROUND OF THE INVENTION

1. Field of the Invention

The invention relates to semiconductor resistive elements and was developed with particular attention to the possible use in high voltage applications.

2. Description of the Related Art

In general, in monolith semiconductor power apparatus, such as those made with VIPower technology developed by the Applicant, the need exists for having the substrate voltage partitioned within the control region of the apparatus.

This function can be obtained, for example, by means of a resistor connected between the substrate and the control region in which the substrate voltage is to be detected.

In power applications, the substrate can reach rather high voltage values (up to 2000 V) and the resistor connected therewith must be capable of withstanding the same voltage.

Particularly, when referring to resistive structures capable of detecting the voltage on an electrode (collector or drain) of a power component in monolith integrated semiconductor devices, the use of resistors destined to have high voltage applied to their terminals entails the need to make these resistors with a particularly high electrical resistance, for example higher than 100 KOhm.

Such high resistance values imply the use of considerably high resistance and/or long layers. Consequently, also when employing layers with the highest resistivity in technology, the integration of high voltage resistors implemented according to the prior art requires a large area of silicon.

For example, a serpentine resistive structure integrated on a semiconductor substrate is described in previous European Application EP-A-0996158.

A disadvantage of this type of structure is that the distances to be kept between one branch of the serpentine and another must be greater than the space-charge region which extends in the substrate. Since the substrate presents a low doping level, the dimension of this region is in the order of tens of microns when a high voltage difference is applied. An additional loss in terms of occupied area is produced in making annular regions or field plates of low concentration doped silicon surrounding the resistor to prevent premature breakdowns. Another problem related to this kind of resistor is the interaction with the on-board apparatus structures where they are inserted.

Another type of high voltage resistor of a known type employs a high resistivity semiconductor layer with conductivity opposite to that of the substrate surrounded by a layer of insulating material, for example silicon dioxide. This solution solves the problem of the space-charge region which would tend to short-circuit the facing branches of the resistor. This is because the depth of the insulating material regions is sufficient to prevent this event. However, this solution requires that the resistor be located near the high voltage region of the apparatus and only slightly reduces the occupied area. Furthermore, the possibility of interaction with the structures on-board the apparatus where the resistor is located still exists.

BRIEF SUMMARY OF THE INVENTION

The embodiments of the invention are directed to a structure for a semiconductor resistive element and the respective manufacturing process.

In accordance with one embodiment, resistive structures capable, for example, of detecting the voltage present on an electrode (collector or drain) of the power component in monolith integrated semiconductor devices are provided.

The embodiments of the invention improve the previously known solutions in terms of electrical performance and manufacturing process. For this purpose, according to the currently preferred embodiment of the invention, a second epitaxial layer is grown on a first epitaxial layer and then a layer with a higher doping concentration than the second epitaxial layer, positioned over a buried region, is obtained by photolithography, ion implantation and diffusion. The buried region is of opposite conductivity type to the first epitaxial layer to define a resistive element. Ideally, the buried region includes subregions that are connected in marginal continuity relationship.

BRIEF DESCRIPTION OF THE SEVERAL VIEWS OF THE DRAWING(S)

Figure 2:
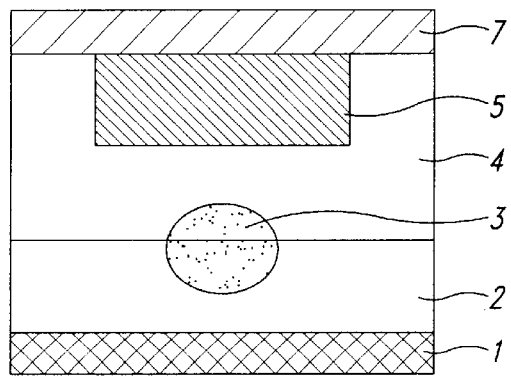
Figure 3:
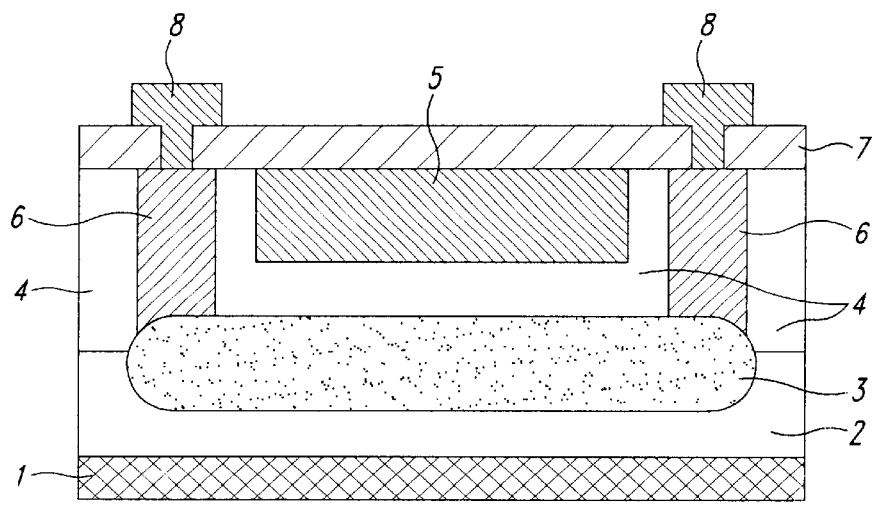
Figure 4:
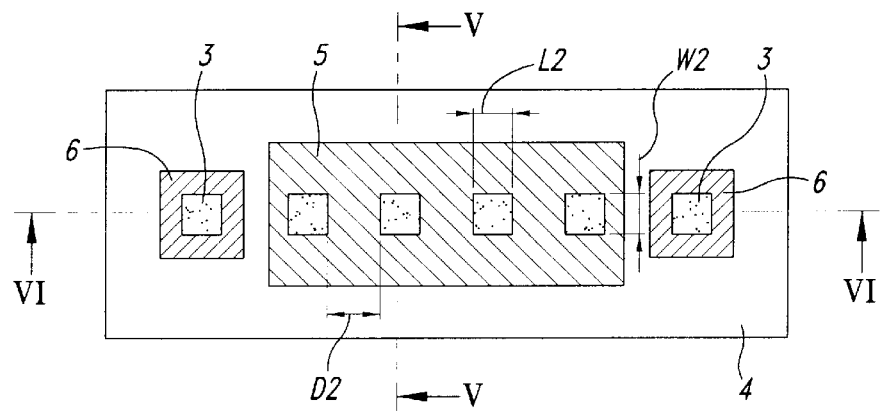
Figure 5:
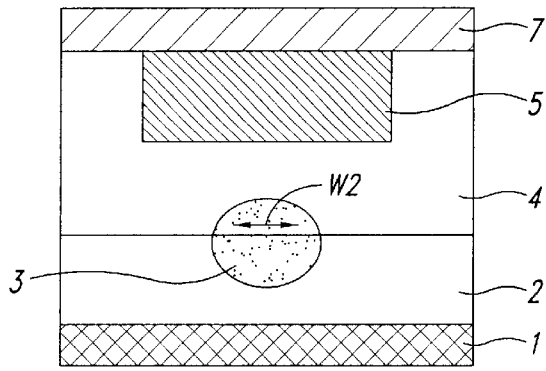
Figure 6:
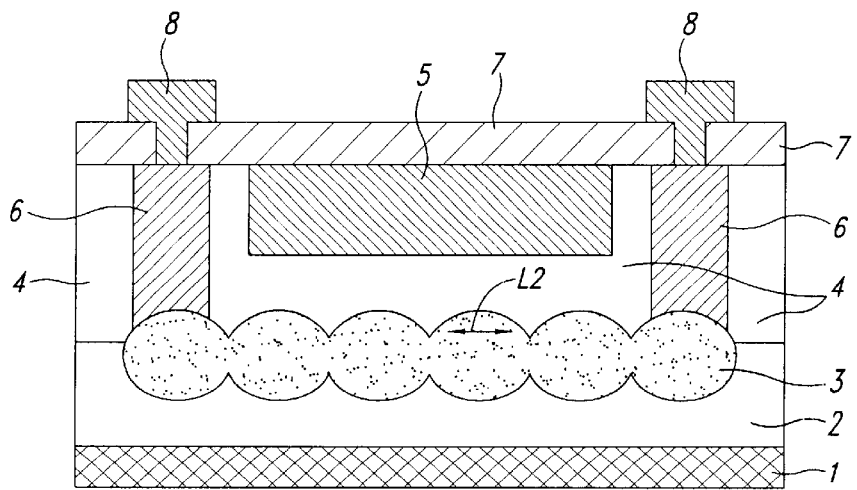
Figure 7:
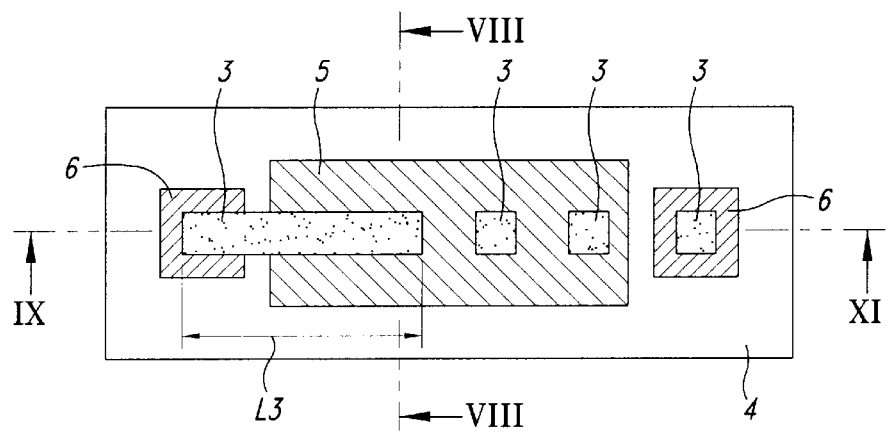
Figure 8:
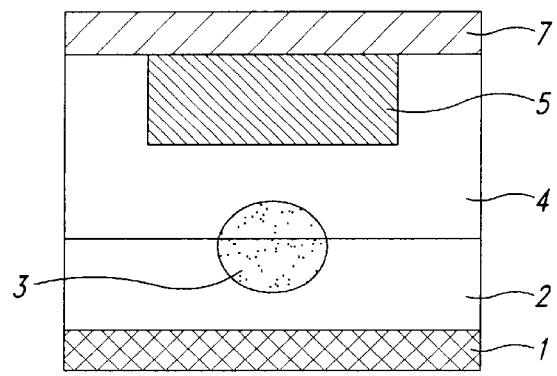
Figure 9:
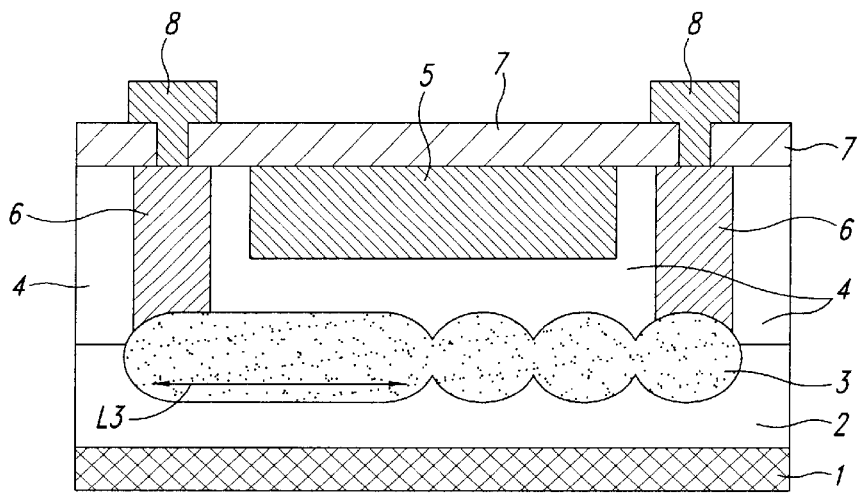
Figure 10:
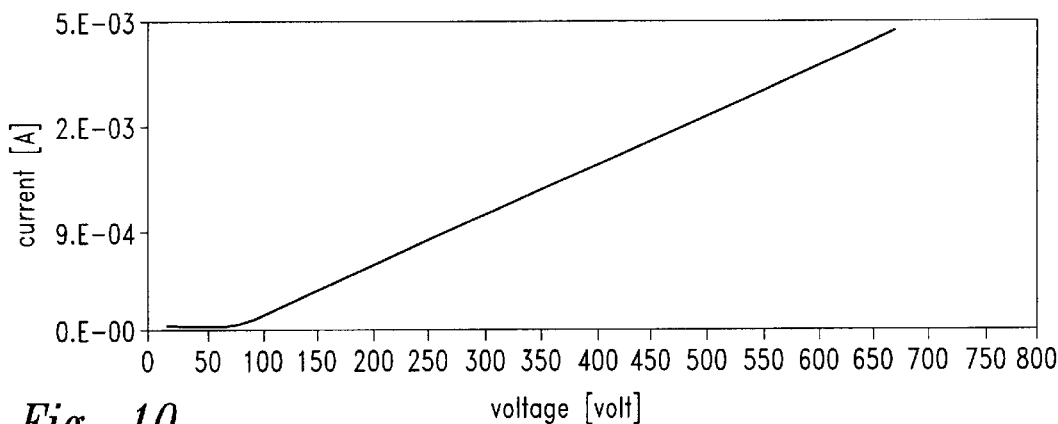
Figure 11:
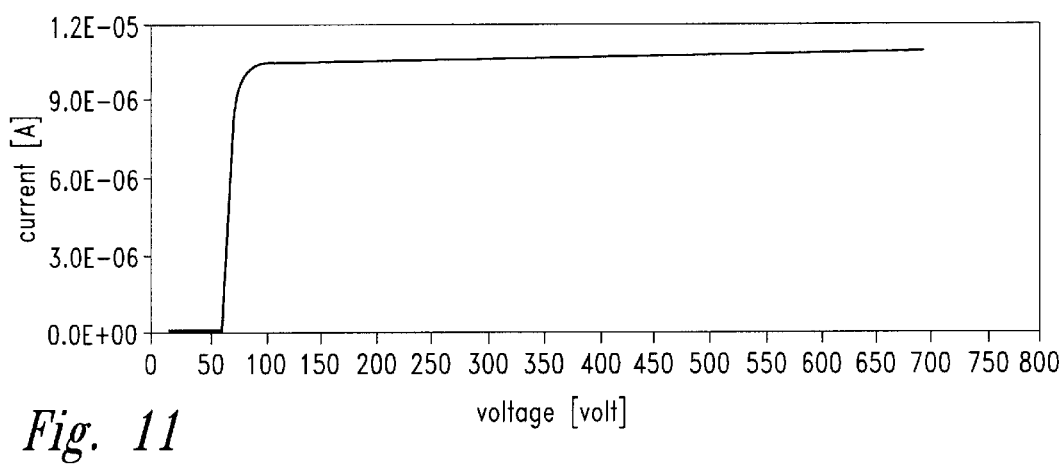
Figure 12:
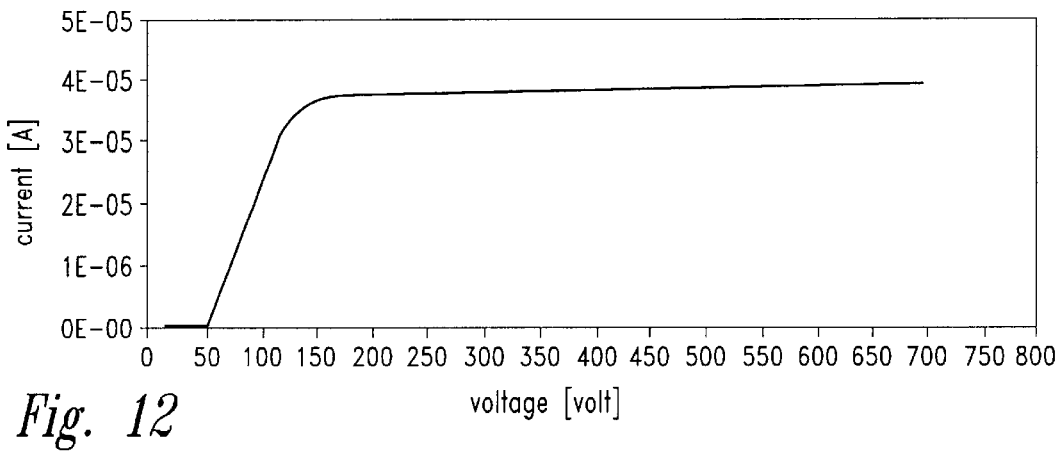

The invention will now be described, by way of example only, with reference to the accompanying drawings, wherein:

FIGS. 1, 4 and 7 are three schematic plan views of respective embodiments of the structure according to the invention, FIGS. 2, 5 and 8 are essentially cross-sectional views, according to line II—II in FIG. 1, line V—V in FIG. 4 and line VII—VII in FIG. 7, respectively, FIGS. 3, 6 and 9 are additional cross-sectional views, according to line III—III in FIG. 1, line VI—VI in FIG. 4 and line IX—IX in FIG. 7, respectively, and FIGS. 10, 11 and 12 are three current/voltage diagrams for exemplifying various behaviors of a resistive element structure according to the invention.

DETAILED DESCRIPTION OF THE INVENTION

In the accompanying Figures, numeral 1 generally refers to a semiconductor substrate (e.g., silicon) presenting a high doping concentration of the n type.

On this semiconductor substrate 1, an epitaxial layer 2 is grown of a homologous type (i.e., also with conductivity of the n type) with a concentration and thickness defined (in a manner known per se) according to the voltage class in which the structure made according to the invention is intended to operate.

A region, generally indicated with numeral 3, of the p type, where p type is a second type of conductivity opposite to the first type of conductivity which is of the type n in the embodiment illustrated herein, is made by ion implantation and subsequent diffusion process.

The region 3 is intended to form the body of the resistive element or resistor and, in other regions of the chip, the buried base of a high voltage BJT transistor as well as the buried insulating region.

The specific implementation methods of the region 3 are the main element of distinction between the three embodiments, illustrated in FIGS. 1 to 3 (a first embodiment), FIGS. 4 to 6 (a second embodiment), and FIGS. 7 to 9 (a third embodiment), respectively.

With reference to this, it will be noted that FIGS. 1, 4 and 7 refer to the conditions attained after the implantation process, while FIGS. 2–3, 5–6 and 8–9 of the respective embodiments refer to the results obtained after the diffusion process.

In the first embodiment shown in FIGS. 1 to 3, the region 3 is essentially made in the form of a sort of cylindrical bar with end regions rounded as a result of the diffusion process. Consequently, in this first embodiment, region 3 is essentially uniform along its entire development in the main direction of extension.

Conversely, in the second embodiment shown in FIGS. 4 to 6, the region 3 is made in the form of a set of subregions which, upon implantation (see FIG. 4) have an extension equal to L2 and are reciprocally separated by a distance D2. The extension and distance are obviously always defined in the main direction of extension of the region 3, while the concerned subregions (the same is true in general for the region 3 shown in FIGS. 1 to 3) present a width equal to W2 and transversally with respect to region 3.

By effect of the subsequent diffusion treatment, said subregions expand assuming the appearance of spheroids reciprocally connected in a marginal continuity relationship, i.e., so that spheroids are reciprocally approximately tangent, while being actually connected, consequently reciprocally secant, along the entire development of the region 3 in the main direction of extension.

The third embodiment shown in FIGS. 7 to 9 can be seen as a sort of combination of the two embodiments illustrated previously. In this case, region 3 is partially formed by a cylindrical bar with rounded ends, essentially similar to the bar for the region 3 in the first embodiment shown in FIGS. 1 to 3, but "shorter". This shorter bar is connected in a marginal continuity relationship with a plurality of spheroids 3, which are essentially similar to those present in the second embodiment in FIGS. 4 to 6, these spheroids forming the remaining part of the region 3.

Also in this case, the shorter bar is initially made with a length equal to L3, so to be at a distance from the other homologous subregions, which are essentially identical to those shown in FIG. 4. The subsequent diffusion treatment also in this case provides marginal continuity as a result (see FIGS. 5 and 6).

Regardless of the methods adopted for making the region 3, an additional semiconductor epitaxial layer of the n type (herein reference will be made to silicon as a non-limiting example) is deposited on the region 3 and the underlying substrate 2. This will confer to region 3 the characteristic of a buried region.

This second epitaxial layer of the n type (i.e., the first type of conductivity, in the example illustrated here, which is just an example) is indicated with numeral 4 in the accompanying drawings.

Subsequently, a layer n, indicated with numeral 5, is created by photolithography, ion implantation and diffusion on the new surface thus creating a second region. This layer has a higher doping concentration with respect to the epitaxial layer 4.

Specifically, the layer 5, the second region, is positioned over the buried region 3.

Low resistivity regions of the p type, indicated with numeral 6 and intended to form a low resistivity deep contact of the resistor comprised of the region 3 and, in other regions of the chip, the deep base contact of the high voltage BJT, so to complete the insulating region in the control area, are then formed again by photolithography, ion implantation and diffusion.

At this point, the manufacturing process continues and the structure is completed with the required layers (e.g., with an insulating layer of silicon dioxide, indicated with numeral 7). Finally the electrical contacts 8 and the associated electrodes are created by photolithography and deposition.

Those skilled in the art will appreciate the fact that the manufacturing process just described involves carrying out operations and treatment phases which are per se individually well-known in the art and consequently do not require a detail description in herein.

By adopting the described structure, a resistive element can be produced which demonstrates different behaviors according to the voltage applied across its terminals (practically according to the voltage applied between the electrodes 8 shown in FIGS. 3, 6 and 9).

Particularly, by forming the region 3 with a substantially uniform development in its main direction of extension (as shown in FIG. 1 and 3) and suitable length, a resistor can be produced having a characteristic which is substantially linear over the entire substrate voltage range, i.e., a resistive element whose characteristic is of the type shown in the diagram in FIG. 10.

Conversely, by forming the region 3 according to the embodiment illustrated in FIGS. 4 to 6, i.e., in the form of subregions which are originally separate after implantation and then marginally joined after subsequent diffusion, the resistive element presents a characteristic that is comparable to that of a jfet, i.e., a characteristic of the type shown in the diagram of FIG. 11.

In this case, the behavior of the structure is regulated by the width W2 in addition to the length L2 of the single implanted subregions and by the distance D2 at which they are implanted.

An embodiment of the type illustrated in FIGS. 7 to 9 can be used to make a resistive element presenting a characteristic which is to a certain extent intermediate between that shown in FIG. 10 and that shown in FIG. 11, i.e., a characteristic of the type shown in FIG. 12.

Specifically, when an embodiment of the type shown in FIGS. 7 to 9 is adopted, the resistance value of the linear section of the electrical characteristics (see the characteristic part essentially comprised between the abscissa values equal to 50V and 150V in the diagram in FIG. 12) can be determined by operating on the value of the length L3.

A behavior of the type shown in FIGS. 11 and 12, namely, forms a linear voltage/current characteristic (constant resistance) for a certain initial range of voltage values, and a subsequent marked increase of the resistance value determined by the substantial stabilization, according to a typically asymptotic trend, of the intensity of the current through the resistive element for voltage values exceeding said initial field. Also, the behavior can be advantageously exploited in the context of techniques for controlling the step response in high voltage devices, such as electronic ignition systems.

This all according to the methods better described in a co-pending U.S. patent application, entitled System and Process for Controlling the Step Response of Electronic Components, filed concurrently herewith in the name of the Applicant, and which is incorporated in its entirety herein by reference.

In any case, the non-limiting embodiments described in the instant application can be used to make a resistive element which is not affected by surface MOS parasite effects, thanks to the layer n overlying the body of the resistor which prevents the formation of surface conductive channels due to charge possibly contained in the silicon oxide.

The structure according to the invention can be integrated in an integrated power device (e.g., of the PIC or VIPower type) since all the layers used to make the component are already present in the process sequence.

Furthermore, the structure according to the invention presents a surface area which is considerably reduced when compared with prior art resistors, since it is possible to obtain high resistance values, particularly by using an embodiment which provides a performance comparable to that of a jfet.

Naturally, numerous changes can be implemented to the construction and embodiments of the invention herein envisaged, without departing from the scope of the invention. This particularly but not exclusively refers to the possibility of using different semiconductor materials, e.g., SiC, for making the various layers/regions of the structure according to this invention, and making the layers/regions described above with types of conductivity (p or n) which are opposite with respect to those described: e.g., layers 1, 2, 4 and 5 of the p type and the regions 3 and 6 of the n type. In this sense, the expressions "first type of conductivity" and "second type of conductivity" can refer both to conductivity of the n type and to conductivity of the p type, notwithstanding the opposite character of the first type and of the second type of conductivity.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A structure for a semiconductor resistive element, comprising:
    a first layer with a first type of conductivity;
    a region with a second type of conductivity arranged on said first layer, said region defining the resistive element proper;
    a second layer with said first type of conductivity grown on said first layer to make said region a buried region, said buried region configured to present a main direction of
    extension and, at least in part, a development that is substantially uniform in said main direction of extension; and
    an additional layer of said first type of conductivity and having a higher concentration with respect to said second layer, said additional layer positioned above said buried region.

2. The structure of claim 1, comprising a substrate of said first conductivity with a high doping concentration on the side of said first layer opposite to said buried region.

3. The structure of claim 1 wherein said buried region presents a development that is substantially uniform throughout its extension in said main direction.

4. The structure of claim 1 wherein said buried region presents, in part, a development that is substantially uniform in said main direction of extension and, in the remaining part, is formed by subregions that are reciprocally connected in a marginal continuity relationship.

5. The structure of claim 1 wherein said buried region comprises, at least in part, subregions that are reciprocally connected in a marginal continuity relationship.

6. The structure of claim 5 wherein said subregions present an approximately spheroidal conformation.

7. The structure of claim 5 wherein said buried region integrally consists of said subregions reciprocally connected in a marginal continuity relationship.

8. The structure of claim 1, comprising at least one additional region with said second conductivity and with low resistivity forming a contact to said buried region.

9. The structure of claim 1 wherein said first and said second type of conductivity are of the n type or the p type, respectively.

10. A semiconductor resistive structure comprising:
    a semiconductor substrate of a first type of conductivity having a first doping concentration;
    a first layer of a first type of conductivity having a second doping concentration deposited on the semiconductor substrate;
    a first region of a second type of conductivity located in a first area of the first layer to form a resistive structure of a cross-section and a length having a resistive behavior, the first region having a cross section that is periodic for the length of the first region;
    a second layer of a first type of conductivity having a third doping concentration deposited on the first layer;
    a second region of a first type of conductivity having a fourth doping concentration located in a second area of the second layer wherein the second area is located above the first area;
    first and second deep contacts of a second type of conductivity coupled to the first region; and
    first and second electrical contacts coupled to the first and second deep contacts, respectively.

11. The semiconductor resistive structure of claim 10 wherein the fourth doping concentration of the second region is greater than the third doping concentration of the second layer.

12. The semiconductor resistive structure of claim 10 wherein the cross-section of the first region is substantially uniform for the length of the first region.

13. The semiconductor resistive structure of claim 10 wherein the cross-section of the first region is substantially uniform for a first portion of the length of the first region and periodic for a second portion of the length of the first region.

14. The semiconductor resistive structure of claim 10 wherein the resistive behavior is a constant function of a first range of voltage and current.

15. The semiconductor resistive structure of claim 10 wherein the resistive behavior is a linear function of a second range of voltage and current.

16. A structure for a semiconductor resistive element, comprising:
    a first layer with a first type of conductivity;
    a region with a second type of conductivity arranged on said first layer, said region defining the resistive element proper;
    a second layer with said first type of conductivity grown on said first layer to make said region a buried region, the buried region comprising, at least in part, subregions that are reciprocally connected in a marginal continuity relationship; and
    an additional layer of said first type of conductivity and having a higher concentration with respect to said second layer, said additional layer positioned above said buried region.

17. The structure of claim 16, comprising at least one additional region with said second conductivity and with low resisitivity forming a contact to said buried region.

18. The structure of claim 16, wherein said first and said second type of conductivity are of the N type or the P type, respectively.

19. A semiconductor resistive structure comprising:

a semiconductor substrate of a first type of conductivity having a first doping concentration;

a first layer of a first type of conductivity having a second doping concentration deposited on the semiconductor substrate;

a first region of a second type of conductivity located in a first area of the first layer to form a resistive structure of a cross-section and a length having a resistive behavior, the first region having a cross section that is substantially uniform for the length of the first region;

a second layer of a first type of conductivity having a third doping concentration deposited on the first layer;

a second region of a first type of conductivity having a fourth doping concentration located in a second area of the second layer wherein the second area is located above the first area;

first and second deep contacts of a second type of conductivity coupled to the first region; and first and second electrical contacts coupled to the first and second deep contacts, respectively.

20. The semiconductor resistive structure of claim 19, wherein the fourth doping concentration of the second region is greater than the third doping concentration of the second layer.

21. The semiconductor resistive structure of claim 19, wherein the resistive behavior is a constant function of a first range of voltage and current.

22. The semiconductor resistive structure of claim 19, wherein the resistive behavior is a linear function of a second range of voltage and current.

23. A semiconductor resistive structure comprising:

a semiconductor substrate of a first type of conductivity having a first doping concentration;

a first layer of a first type of conductivity having a second doping concentration deposited on the semiconductor substrate;

a first region of a second type of conductivity located in a first area of the first layer to form a resistive structure of a cross-section and a length having a resistive behavior, the first region having a cross section that is substantially uniform for a first portion of the length of the first region and periodic for a second portion of the length of the first region;

a second layer of a first type of conductivity having a third doping concentration deposited on the first layer;

a second region of a first type of conductivity having a fourth doping concentration located in a second area of the second layer wherein the second area is located above the first area;

first and second deep contacts of a second type of conductivity coupled to the first region; and first and second electrical contacts coupled to the first and second deep contacts, respectively.

24. The semiconductor resistive structure of claim 23, wherein the fourth doping concentration of the second region is greater than the third doping concentration of the second layer.

25. The semiconductor resistive structure of claim 23, wherein the resistive behavior is a constant function of a first range of voltage and current.

26. The semiconductor resistive structure of claim 23, wherein the resistive behavior is a linear function of a second range of voltage and current.

* * * * *